United States Patent [19]

Kuraishi

[11] Patent Number: 4,876,544
[45] Date of Patent: Oct. 24, 1989

[54] OVERSAMPLING A/D CONVERTER COMPRISING AN ADDITIONAL CAPACITOR SWITCHED IN SYNCHRONISM WITH SWITCHIN OF AN INPUT CAPACITOR

[75] Inventor: Yoshiaki Kuraishi, Tokyo, Japan
[73] Assignee: NEC Corporation, Tokyo, Japan
[21] Appl. No.: 179,458
[22] Filed: Apr. 8, 1988
[30] Foreign Application Priority Data
  Apr. 10, 1987 [JP]  Japan .................................. 62-88232
[51] Int. Cl.$^4$ .............................................. H03M 1/50
[52] U.S. Cl. .................................... 341/166; 341/163;
                                                     341/122; 341/155
[58] Field of Search ................ 341/122, 123, 166, 167,
                                                              341/163

[56] References Cited
U.S. PATENT DOCUMENTS
  4,684,925  8/1987  Maruta ................................ 341/166
  4,736,188  4/1988  Jackson ............................... 341/163

Primary Examiner—William M. Shoop, Jr.
Assistant Examiner—Helen Kim
Attorney, Agent, or Firm—Sughrue, Mion, Zinn, Macpeak & Seas

[57] ABSTRACT

Besides an input switched capacitor (14) for sampling an input analog signal into output electric charges, an oversampling analog-to-digital converter comprises an additional switched capacitor (47) for sampling, into additional electric charges in synchronism with the input switched capacitor, controlled electric charges produced by a capacitor array (24) which is coupled to a reference voltage source (23) and is controlled by a predetermined number of control signals produced by a control logic (22) in response to an output digital signal. A summing circuit delivers the output and the additional electric charges to an integrator (15) connected to a quantizer (21) which produces a quantized signal substantially identical with the digital signal. Preferably, the summing circuit comprises a connecting switch (49) for supplying the output and the additional electric charges to the integrator in synchronism with the input and the additional switched capacitors. A switch array (25) is controlled by the control signals to make the capacitor array produce the controlled electric charges.

3 Claims, 4 Drawing Sheets

OVERSAMPLING A/D CONVERTER COMPRISING AN ADDITIONAL CAPACITOR SWITCHED IN SYNCHRONISM WITH SWITCHIN OF AN INPUT CAPACITOR

BACKGROUND OF THE INVENTION

This invention relates to an oversampling analog-to-digital (A/D or A-to-D) converter for sampling an input analog signal at an oversampling frequency into an output digital signal.

An oversampling analog-to-digital converter is ordinarily manufactured by using a very large scale integration techology and is useful in digital communication. With an oversampling analog-to-digital converter, an input analog signal of an input signal frequency bandwidth is sampled into an output digital signal at an oversampling frequency which is much higher than the input signal frequency bandwidth, for example, higher than one hundred times the input signal frequency bandwidth.

An oversampling analog-to-digital converter is disclosed in a report contributed jointly by Akira Yukawa, Rikio Maruta, Yuuichi Kawakami, and Kyuichi Hareyama as Report No. 563 in Japanese and with a title in English to "Syôwa 59-nendo Densi Tûsin Gakkai Tûsin Bumon Zenkoku Taikai Ronbunsyû" (Reports for 1984 General Meeting of Communication Branch of the Institute of Electronics and Communication Engineers of Japan), under the title of "An Oversampling A/D Converter Circuit Configuration for Digital Codec IC." A similar and other oversampling analog-to-digital converters are discussed in a paper contributed jointly by Akira Yukawa, Rikio Maruta, and Kenji Nakayama to Proceedings of IEEE International Conference on Acoustics, Speech, and Signal Processing held March 1985, pages 1400 to 1403, under the title of "An Oversampling A-to-D Converter structure for VLSI Digital CODEC's."

According to the Yukawa et al. report and the Yukawa et al. paper, an oversampling analog-to-digital converter has a converter input terminal supplied with an input analog signal. An input switched capacitor is connected to the input terminal and is for sampling the analog signal into output electric charges. An integrator is for integrating input electric charges into an integrated signal, which is quantized by a quantizer into an output digital signal. Control logic is used in producing a predetermined number of control signals in response to the digital signal. A capacitor array is connected to a reference voltage source and controlled by the control signals to produce controlled electric charges. A connection is used in combining the input switched capacitor and the capacitor array to the integrator to combine the output electric charges and the controlled electric charges into the input electric charges.

The oversampling analog-to-digital converter of the Yukawa et al report or the Yukawa et al. paper operates very well with the analog signal of an input signal dynamic range which is approximately as wide as a power source voltage used in putting the converter into operation. It should, however, be pointed out in the manner which will later be described more in detail that the integrator is not operable at a high speed in the converter of Yukawa et al. This imposes an undesirable restriction on the oversampling frequency. If the integrator is somehow adapted to a high-speed operation, analog-to-digital conversion imprecise. Furthermore, the converter becomes requires greatly increased power.

SUMMARY OF THE INVENTION

It is therefore an object of the present invention to provide an oversampling analog-to-digital converter which is operable at a high oversampling frequency.

It is another object of this invention to provide an oversampling analog-to-digital converter of the type described, which comprises an integrator operable at a high speed.

It is still another object of this invention to provide an oversampling analog-to-digital converter of the type described, by which analog-to-digital conversion can precisely be carried out.

It is yet another object of this invention to provide an oversampling analog-to-digital converter of the type described, for which increased power consumption is unnecessary.

Other objects of this invention will become clear as the description proceeds.

For describing the gist of this invention it is possible to understand that an oversampling analog-to-digital converter has a converter input terminal supplied with an input analog signal and comprises an input switched capacitor connected to the input terminal for sampling the analog signal into output electric charges, an integrator for integrating input electric charges into an integrated signal, a quantizer for quantizing the integrated signal into an output digital signal, control logic responsive to the digital signal for producing a predetermined number of control signals, a reference voltage source, a capacitor array coupled to the reference voltage source and responsive to the control signals for producing controlled electric charges, and combining means connected to the input switched capacitor, the capacitor array, and the integrator for combining the output electric charges and the controlled electric charges into the input electric charges.

According to this invention, the above-described oversampling analog-to-digital converter is characterized in that the combining means comprises: (A) an additional switched capacitor connected to the capacitor array for sampling in cooperation with the capacitor array the controlled electric charges into additional electric charges in synchronism with sampling of the analog signal; and (B) summing means connected to the input switched capacitor, the additional switched capacitor, and the integrator for summing the output electric charges and the additional electric charges into the input electric charges.

BRIEF DESCRIPTION OF THE DRAWINGS

FIG. 2, is a block diagram of a basic control logic for use in describing the control logic shown in FIG. 2.

DESCRIPTION OF THE PREFERRED EMBODIMENT

Figure 1:
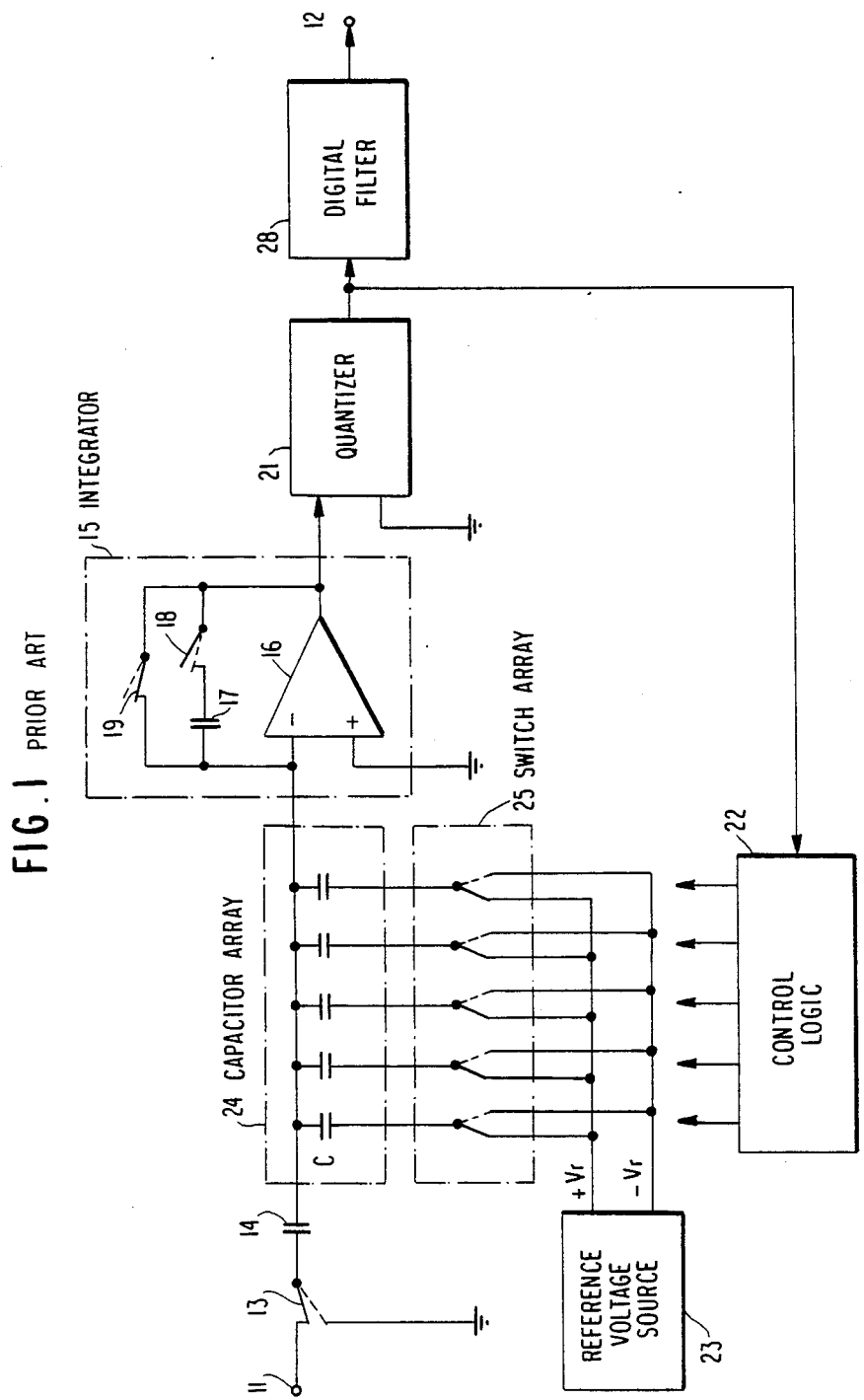
FIG. 1 is a block diagram of a conventional oversampling analog-to-digital converter.

Referring to FIG. 1, a conventional oversampling analog-to-digital (A/D or A-to-D) converter will be described first in order to facilitate an understanding of the present invention. The conventional oversampling analog-to-digital converter is illustrated in FIG. 1 with a slight modification effected on the oversampling analog-to-digital converter revealed in the Yukawa et al report and the Yukawa et al paper, both referred to hereinabove.

The oversampling analog-to-digital converter has converter input and output terminals 11 and 12. The converter input terminal 11 is supplied with an input analog signal which has an input signal frequency bandwidth, an input amplitude, and an input dynamic range and should be oversampled at an oversampling frequency. The converter output terminal 12 is for an output digital signal into which the analog signal is oversampled. Typically, the input signal frequency bandwidth is 4 kHZ wide. The oversampling frequency is defined by an oversampling clock sequence and is much higher than the input signal frequency bandwidth, for example, higher than one hundred times the input signal frequency bandwidth. The oversampling clock sequence has alternatingly a binary zero value and a binary one value in each oversampling period.

An input switch 13 is for connecting an input capacitor 14 alternatingly to the converter input terminal 11 and ground when the oversampling clock sequence has the binary one and the binary zero values, respectively. The input capacitor 14 has a first capacitance C1.

An integrator 15 comprises an operational amplifier 16 having a positive or non-inverting input terminal grounded, a negative or inverting input terminal, and an amplifier output terminal. An integrating capacitor 17 has a second capacitance C2 and is connected to the negative input terminal directly and to the amplifier output terminal through a closing switch 18. An opening switch 19 is connected between the negative input terminal and the amplifier output terminal. The closing and the opening switches 18 and 19 are operable in synchronism with the input switch 13 in the manner which will presently become clear. The integrator 15 integrates input electric charges supplied to the negative input terminal and produces an integrated signal from the amplifier output terminal.

A quantizer 21 is for quantizing the integrated signal into a quantized signal. Each bit of the quantized signal has one of a preselected number of quantization levels. In the manner known in the art, such a quantized signal is unavoidably accompanied by quantization noise. It is, however, possible to understand insofar as an oversampling analog-to-digital converter is concerned that the quantized signal is not much different from the output digital signal.

In the example being illustrated, the quantizer 21 is implemented by a comparator which has a first comparison input terminal supplied with the integrated signal and a second comparison input terminal grounded. The quantizer 21 therefore produces the quantized signal with each bit made to have one of a positive and a negative level in each oversampling period as one of two quantization levels. In other words, the quantized signal represents positive and negative signs.

Responsive to the output digital signal, control logic 22 produces a predetermined number of control signals. When the predetermined number is denoted by a capital letter K, the control signals can be identified as first through K-th control signals. It will become clear later that each of such control signals has one of the binary one and zero values in each oversampling period depending on a plurality of digital signal bits which are equal in number to $2^K$ and precedes the oversampling period under consideration as preceding bits in the digital signal. In the illustrated example, the predetermined number is equal to five.

A reference voltage source 23 is depicted to produce a positive reference voltage ($+Vr$) and a negative reference voltage ($-Vr$). A capacitor array 24 comprises a common signal line, a reference capacitor having a reference capacitance C, and a plurality of weighted capacitors, (K−1) in number. The reference capacitor will alternatively be called a first capacitor. Under the circumstances, the weighted capacitors are a second through a K-th capacitor and have weighted capacitances which are equal to 2, $2^2$, $2^3$, ..., and $2^{K-1}$ times the reference capacitance, respectively. That is, the weighted capacitances are equal to $2^k$ times the referece capacitance where the lower case k represents natural numbers starting at unity and ending at the predetermined number less one. In the case under consideration where the predetermined number is equal to five, the weighted capacitances are equal to 20, 40, 80, and 160.

A binary number of a plurality of binary bits, K in number, is represented by the first through the K-th control signals. The binary number is equal to a variable decimal number L which is given by:

$$L = \sum_{k=1}^{K} (b_k \cdot 2^{k-1}) \tag{1}$$

where the coefficients $b_k$ in the summation represent unity and zero depending on the above-mentioned preceding bits of the output digital signal. The variable decimal number has a minimum value of zero and a maximum value of $(2^{K-1}-1)$ only when each coefficient specifically represents zero and unity, respectively. Otherwise, the variable decimal number is between the minimum and the maximum values, both exclusive.

In the capacitor array 24, the reference capacitor and the weighted capacitors have their one ends connected to the common signal line. Other ends of the reference and the weighted capacitors are connected to the reference voltage source 23 individually through first through K-th switches which are controlled by the first through the K-th control signals, respectively. In this manner, each of the first through the K-th switches correspond to one of the first through the K-th capacitors and to one of the first through the K-th control signals. Through each of the first through the K-th switches, a corresponding one of the first through the K-th capacitors is supplied with the positive reference voltage when a corresponding one of the first through the K-th control signals has the binary zero value. The corresponding one of the capacitors is supplied with the negative reference voltage when the corresponding control signal has the binary one value. In this manner, a combination of the first through the K-th switches serves as a switch array 25 for controllably connecting the capacitor array 24 to the reference voltage source 23.

Controlled by the respective control signals, the reference capacitor and the weighted capacitors collectively produce controlled electric charges Qc which depend on the above-mentioned variable decimal number L and are equal to 2Vr·C·L. The controlled electric charges reach a maximum when the variable decimal number has the maximum value, namely, when each coefficient represents unity in Equation (1).

It is now understood that the capacitor array 24 is coupled to the refrence voltage source 23 and is controlled by the control signals to produce the controlled electric charges. More particularly, the reference and the weighted capacitors are connected directly to the common signal line and coupled to the control logic 22 through the switch array 25 to be controlled by the respective control signals and to collectively produce the controlled electric charges.

Figure 2:
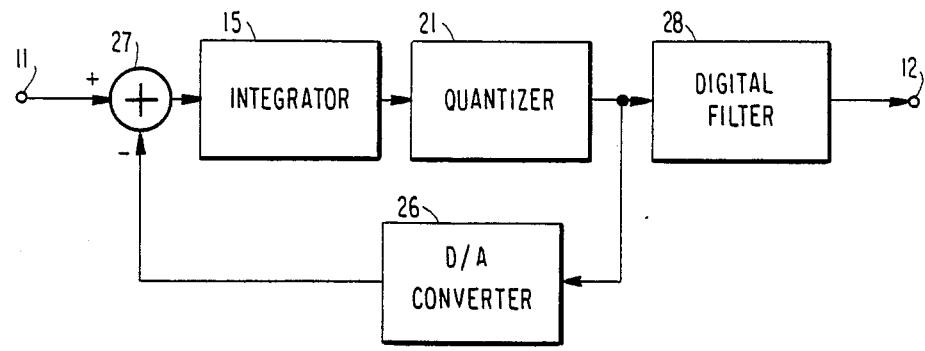
FIG. 2 is a block diagram of a basic oversampling analog-to-digital converter.

Turning to FIG. 2, a basic oversampling analog-to-digital converter has converter input and output terminals and comprises an integrator and a quantizer which correspond to similar parts described in conjunction with FIG. 1 and are designated by like reference numerals 11, 12, 15, and 21. Supplied with the quantized signal from th34 quantizer 21, a digital-to-analog (D/A) converter 26 produces a local ahalog signal. An adder 27 is for subtracting the local analog signal from the input analog signal to produce a difference analog signal. Responsive to the difference analog signal, the integrator 15 delivers the integrated signal to the quantizer 21.

A feedback loop is formed in this manner by the adder 27, the integrator 15, the quantizer 21, and the digital-to-analog converter 26. A combination of the digital-to-analog converter 26 and the adder 27 is implemented in FIG. 1 by the input switched capacitor, the control logic 22, the capacitor array 24 controlled by the control signals, and the closing and the opening switches 18 and 19. The feedback loop is therefore put in operation at the oversampling frequency. In this case, the quantization noise is localized to a high frequency band of the quantized signal. A digital filter 28 is used to remove the quantization noise from the quantized signal to deliver the output digital signal to the converter output terminal 12 with high precision. Inasmuch as the quantization noise is localized to the high frequency band, the quantized signal is substantially identical with the digital signal.

Turning back to FIG. 1, each of the first capacitance C1 of the input capacitor 14 and the second capacitance C2 of the integrating capacitor 17 is equal to thirty-two times the reference capacitor C, namely, equal to 32C. At each sampling instant when the input capacitor 14 is connected to the converter input terminal 1ᵢ through the input switch 13 while the opening switch 19 is kept closed, the input capacitor 14 has electric charges which are equal to 32C·Vi where Vi represents an instantaneous voltage which the input analog signal has at the sampling instant under consideration.

Outwardly of the capacitor array 24, the common signal line is extended to the input capacitor 14 and to a point of connection between the integrating capacitor 17 and the negative input terminal of the operational amplifier 16. When the input capacitor 14 is grounded through the input switch 13 concurrently with closure of the closing switch 18, the electric charges of the input capacitor 14 are moved to the integrating capacitor 17 as the output electric charges through the common signal line. At the same time, the controlled electric charges are moved from the common signal line to the integrating capacitor 17. It is therefore understood in connection with the example being illustrated that the common signal line of the capacitor array 24 serves as a combining arrangement connected to the input switched capacitor, the capacitor array 24, and the integrator 15 for combining the output electric charges and the controlled electric charges into the input electric charges.

As a consequence, the integrating capacitor 17 is given moved electric charges Qm which result from the controlled electric charges and the output electric charges and are equal to (2Vr·C·L−32C·Vi). The integrator 15 produces the integrated signal with an integrated voltage Vo which corresponds to a difference calculated by the adder 27 described in conjunction with FIG. 2 between the voltage Vi of the input analog signal and a voltage of the local analog signal produced by the digital-to-analog converter 26 depicted in FIG. 2. The integrated voltage Vo is given by:

$$Vo = Qm/(32C) = 2Vr \cdot L/32 - Vi \qquad (2)$$

It should be noted in FIG. 1 that the integrator 15 is operable at a speed which is limited by the second capacitance C2 of the integrating capacitor 17. To be more specific, the integrating capacitor 17 is connected to the amplifier output terminal of the operational amplifier 16. The second capacitance is as large as 32C. The operational amplifier 16 inevitably has an output resistance R. The speed of operation of the integrator 15 is subjected to a limitation by a time constant which is equal to 32C.R. As a consequence, the integrator 15 can not be operable at a high speed. This imposes an undesirable restriction on the oversampling frequency.

It is seemingly possible to raise the speed of operation of the integrator 15 by reducing the second capacitance C2. It is, however, difficult in practice to make a capacitor have a small capacitance accurately. It becomes impossible to make the oversampling analog-to-digital converter precisely carry out the analog-to-digital conversion.

The operational speed of the integrator 15 can alternatively be raised by reducing the output resistance of the operational amplifier 16. It is in fact possible to reduce the output resistance. This, however, results in an intricate output circuit and accordingly in unduly increased power consumption.

Figure 3:
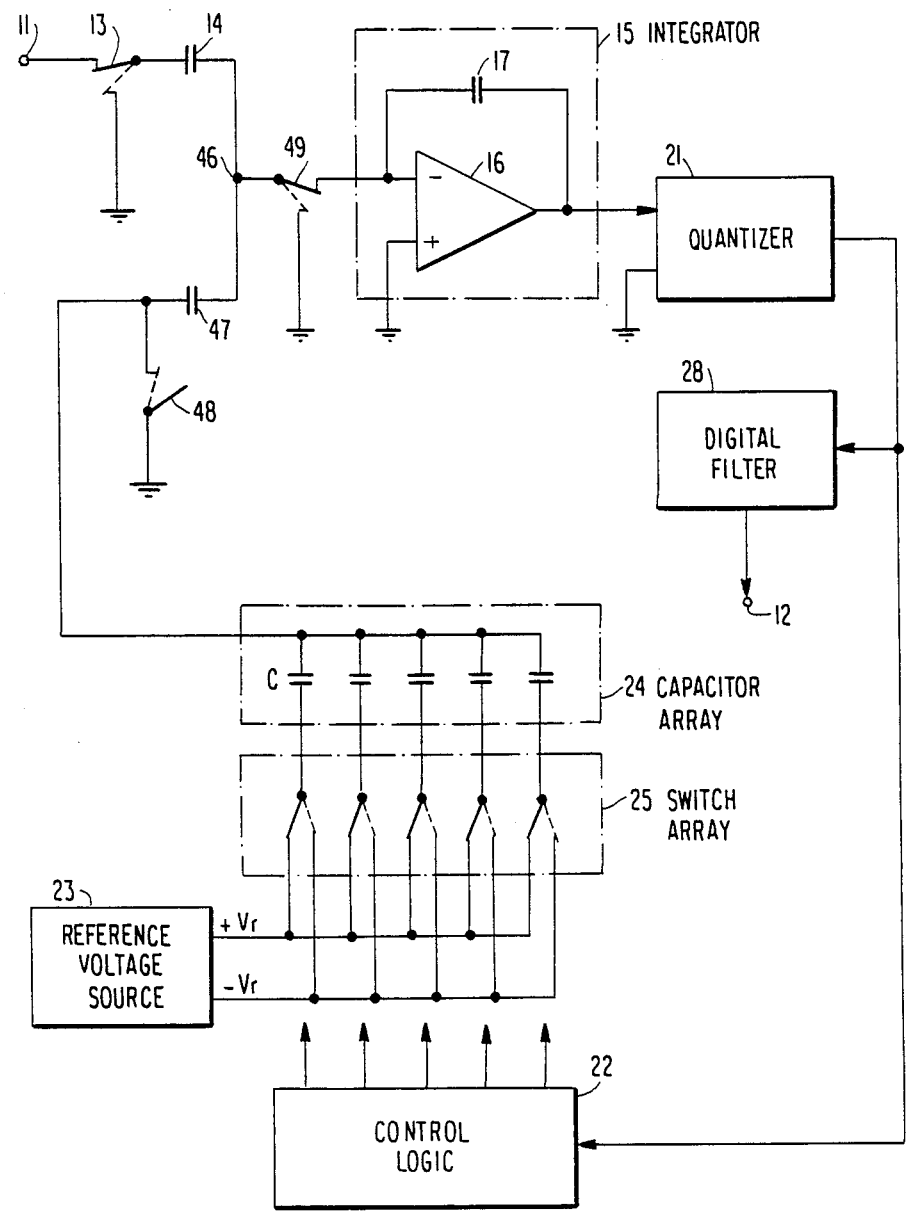
FIG. 3 shows, in blocks, an oversampling analog-to-digital converter according to an embodiment of the instant invention.

Referring now to FIG. 3, the description will proceed to an oversampling analog-to-digital converter according to a preferred embodiment of this invention. The converter has converter input and output terminals and comprises similar parts which are designated by like reference numerals 11 through 17, 21 through 25, and 28.

It should be noted with respect to this converter that the values of the first capacitance C1 of the input capacitor 14 and the second capacitance C2 of the integrating capacitor 17 are significantly smaller than the first and the second capacitances described in connection with FIG. 1. The first and the second capacitances C1 and C2 will be explained later. Incidentally, a controlled voltage is developed by the controlled electric charges Qc on the common signal line of the capacitor array 24.

Figure 4:
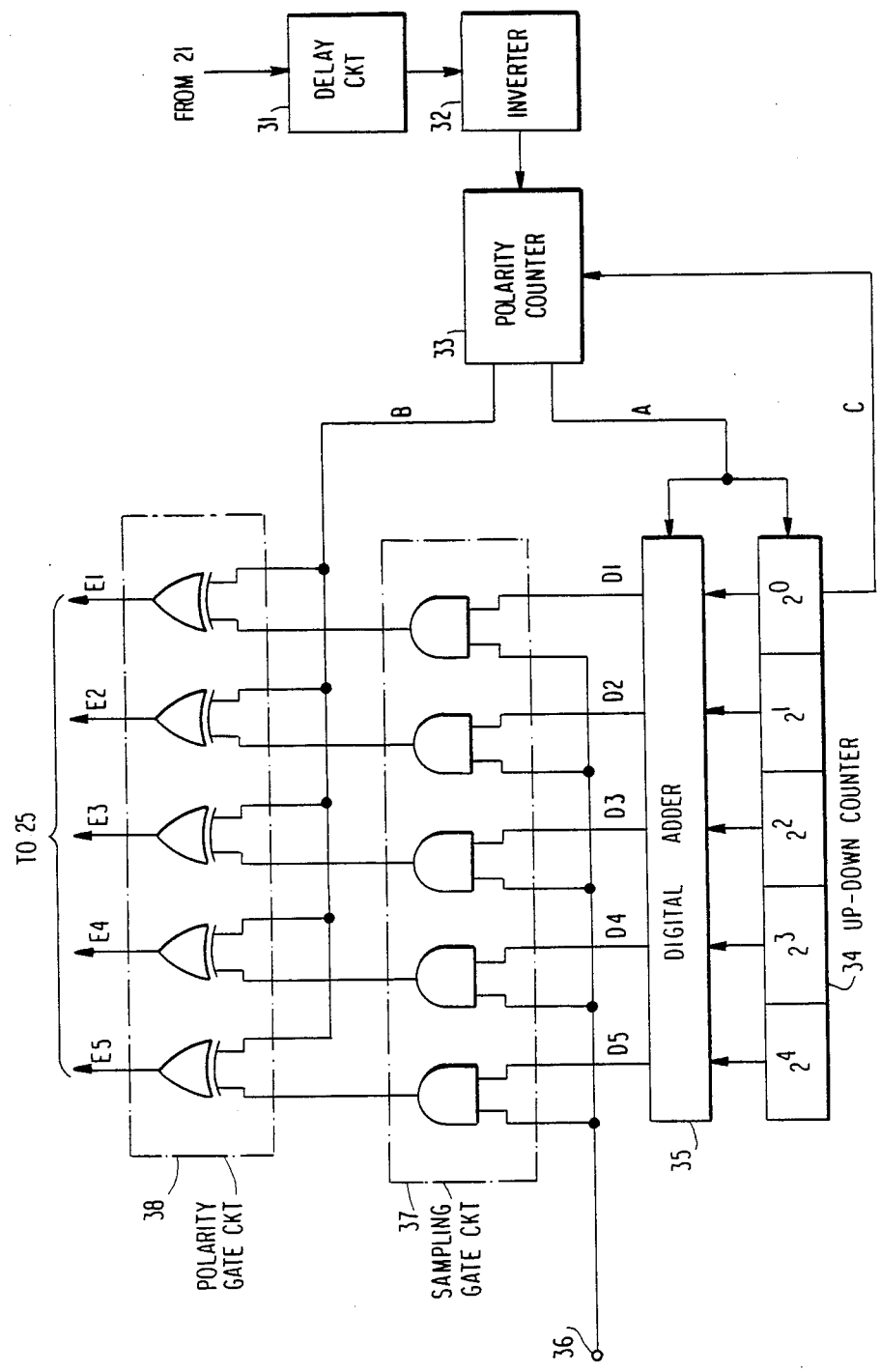
FIG. 4 is a block diagram of a control logic for use in the oversampling analog-to-digital converter illustrated in FIG. 3.

Turning temporarily to FIG. 4, the control logic 22 will be described in more detail. It will be presumed that the predetermined number K is equal to five as before.

A delay circuit 31 gives a delay one of oversampling period to the quantized signal which is supplied from the quantizer 21 depicted in FIGS. 1 through 3 and may be called the output digital signal in the manner pointed out above. The delay circuit 31 thereby produces a delayed digital signal, which is inverted by an inverter 32 into an inverted digital signal. When the input analog signal is higher than the controlled signal, the integrated voltage Vo becomes negative according to Equation (2). In this case, the inverted signal has a positive level. When the analog signal is lower than the controlled signal, the inverted signal has a negative level.

In the manner known in the art, a polarity counter 33 is supplied with the inverted signal to produce a count signal A and a polarity signal B. The count signal A is used in counting up and down an up-down count in an up-down counter 34. Inasmuch as the predetermined number K is equal to five, the up-down counter 34 has first through fifth stages $2^0$ to $2^4$ to supply a digital adder 35 with first through fifth binary signals collectively representative of the up-down count. When the up-down count reaches 00000 and should be further counted down, the up-down counter 34 delivers a switching signal C (designated by the reference letter for the reference capacitance merely for convenience) to the polarity counter 33.

It will be assumed that the converter input terminal 11 (FIGS. 1 to 3) is supplied with the input analog signal which is positive and increasing. In the meanwhile, the polarity signal B has the binary zero value. When the inverted signal has the positive level, the count signal A has the binary one value to count up the up-down count in the up-down counter 34. When the inverted signal has the negative level, the count signal A has the binary zero value to count down the up-down count.

It will be assumed that the input analog signal is negative and has an increasing amplitude. In this event, the polarity signal B has the binary one value. When the inverted signal has the positive level, the count signal A has the binary zero value to count down the up-down count. When the inverted signal has the negative level, the count signal A has the binary one value to count up the up-down count.

As a result, the first through the fifth binary signals are produced by the up-down counter 34 so that the up-down count follows a change in the input analog signal. Adding as a sum the binary one or zero value of the count signal A supplied from the polarity counter 33, the digital adder 35 produces first through fifth digital signals D1 to D5.

A clock input terminal 36 is supplied with the oversampling clock sequence. It should be noted that the oversampling clock sequence is delivered through connections (not depicted merely for simplicity of illustration) to the input switch 13 (FIG. 3) and to two other switches which will shortly be described.

In the example being illustrated, a sampling gate circuit 37 consists of first through fifth AND gates supplied with the first through the fifth digital signals D1 to D5, respectively, and with the oversapling clock sequence in common. A polarity gate circuit 38 consists of first through fifth Exclusive OR gates which are coupled to the first through the fifth AND gates, respectively, and are supplied with the polarity signal B in common. At each sampling instant where the oversampling clock sequence has the binary one value, the first through the fifth digital signals D1 to D5 are delivered through the sampling gate circuit 37 to the polarity gate circuit 38 as they are. At each integrating instant where the oversampling clock sequence has the binary zero value, the sampling gate circuit 37 delivers the binary zero value to the polarity gate circuit 38.

In the polarity gate circuit 38, the first through the fifth Exclusive OR gates produce first through fifth unit signals E1 to E5, respectively. It will be surmised that the polarity signal B has the binary zero value. In this case, the unit signals E1 through E5 hae the binary one and/or zero values which are identical in each sampling instant with those had by digital signals D1 through D5, respectively. The unit signals E1 through E5 simultaneously have the binary zero value in each integrating instant. When the polarity signal B has the binary one value, the unit signals E1 through E5 are inverses of the respective digital signals D1 to D5 in each sampling instant. The unit signals E1 through E5 concurrently have the binary one value in each integrating instant.

Figure 5:
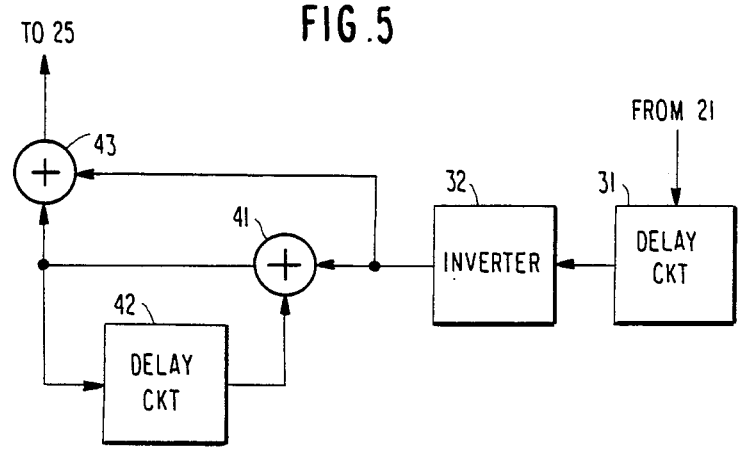
FIG. 5, drawn below

Further turning to FIG. 5, basic control logic will be described for a better understanding of the control logic 22 illustrated with reference to FIG. 4. FIG. 5 is a reproduction of one of eight figures which are shown in the Yukawa et al. paper referenced heretobefore.

The basic control logic comprises a first delay circuit and an inverter which correspond to the delay circuit 31 and the inverter 32 described in conjunction with FIG. 4 and are therefore designated by the reference numerals 31 and 32. The inverted signal is delivered to an input adder 41 which produces a first sum signal in the manner which become clear shortly. A second delay circuit 42 gives a delay of one oversampling period to the first sum signal to produce a delayed sum signal, which is delivered to the input adder 41 to result in the first sum signal. An output adder 43 produces a second sum signal representative of a sum of the inverted signal and the first sum signal.

It will be understood that a combination of the input adder 41 and the second delay circuit 42 serves as a digital integrator for integrating the inverted signal and is implemented in FIG. 4 by the up-down counter 34. The output adder 43 corresponds in FIG. 4 to the digital adder 35.

Referring back to FIG. 3, the first through the fifth control signals are the first through the fifth unit signals E1 to E5 described in connection with FIG. 4. In the switch array 25, a first switch supplies the reference capacitor of the reference capacitance C with the negative reference voltage ($-Vr$) and the positive reference voltage ($+Vr$) when the first control signal has the binary zero and the binary one values, respectively. In this manner, the capacitor array 24 produces the controlled signal described above.

It may be mentioned here that the predetermined number K is determined as follows. In the manner taught in the Yukawa et al report referred to hereinabove, the oversampling frequency is given by:

$$Fc = 2\pi \cdot f \cdot A/S,$$

where Fc represents the oversampling frequency, f represents the input signal frequency bandwidth, A (designated by the reference letter for the count signal merely for convenience) represents a half of the aforedescribed input signal dynamic range, and S represents a unit step voltage of the controlled signal, namely, is equal to the absolute value of the positive and the negative reference voltage over the maximum value of the variable decimal number L described before. In consideration of the input signal dynamic range, the predetermined number K is determined in compliance with:

$$K \geq \log_2 (2A/S) = \log_2 (Fc/[\pi \cdot f])$$

If, 1,024 kHz is used as the oversampling frequency for an input analog signal having an input signal frequency bandwidth of 4 kHz, the predetermined number K should be 6.3 or greater, namely, should preferably be equal to seven.

Referring more particularly to FIG. 3, the input capacitor 14 has an input end connected to the input switch 13 and an output end led to a point 46. An additional capacitor 47 is interposed between the point 46 and the common signal line of the capacitor array 24 and has a third capacitance C3 which is of the order of the first or the second capacitance C1 or C2. More specifically, the additional capacitor 47 has a first end connected to the common signal line and a second end connected to the point 46. An additional switch 48 is for disconnecting and connecting the common signal line to ground and consequently the first end of the additional capacitor 47 to ground.

The integrator 15 comprises only the operational amplifier 16 and the integrating capacitor 17 and does not comprise the closing and the opening switches 18 and 19 (FIG. 1). Instead, a connecting switch 49 connects the point 46 of connection between the input and the additional capacitors 14 and 47 to the negative input terminal of the operational amplifier 16 and to ground.

Looking at the switches 13, 48, and 49 more in detail, the input switch 13 connects the input capacitor 14 to the converter input terminal 11 and to ground when the oversampling clock sequence has the binary one and the binary zero values in each oversampling period, respectively. The additional switch 48 disconnects and connects the common signal line and hence the first end of the additional capacitor 47 to ground when the input switch 13 connects the input capacitor 14 to the converter input terminal 11 and to ground, respectively. The connecting switch 49 connects the point 46 of connection to the negative input terminal and to ground when the input switch 13 connects the input capacitor 14 to the converter input terminal 11 and to ground, respectively.

When concurrently grounded through the input switch 13, the additional switch 48, and the connecting switch 49, the input capacitor 14, the additional capacitor 47, and the reference capacitor and the weighted capacitors of the capacitor array 24 have no electric charges. At each sampling instant when the oversampling clock sequence has the binary one value, the input capacitor 14 is switched by the input switch 13 to the converter input terminal 11 to sample the input analog signal into the output electric charges in the manner described before. Being simultaneously disconnected from ground, the additional capacitor 47 is supplied from the capacitor array 24 with the above-mentioned controlled electric charges Qc which is equal to $2Vr \cdot C \cdot L$. The additional capacitor 47 therefore produces additional electric charges in cooperation with the reference and the weighed capacitors, equal in number to the predetermined number K less one. The reference voltages (+Vr) and (−Vr) need not be different from those used in the conventional oversampling analog-to-digital converter illustrated with reference to FIG. 1.

At this instant, the connecting switch 49 is disconnected from ground to deliver the output electric charges and the additional electric charges to the integrator 15 as the afore-mentioned input electric charges.

When calculated by using the conservation law of electric charge, the integrated voltage Vo becomes:

$$Vo = (C3/C2) \cdot 2VrCL/(31C+C3) - (C1/C2) \cdot Vi \qquad (3)$$

which equation is identical with Equation (2) when each of the first through the third capacitances C1 to C3 is equal to the reference capacitance C.

Each of the first through the third capacitances C1 to C3 need not be equal to the reference capacitance C. In this case, Equation (3) is not identical with Equation (2). It is, however, obvious that the oversampling analog-to-digital converter is operable like the conventional one and that each of the first through the third capacitances C1 to C3 should preferably be either substantially equal to the reference capacitance C or be of the order of the reference capacitance C.

Reviewing FIG. 3 in consideration of the foregoing, it is understood that a combination of the additional capacitor 47 and the additional switch 48 serves as an additional switched capacitor connected to the capacitor array 24 to sample the controlled electric charges into the additional electric charges in synchronism with sampling of the input analog signal by the input switched capacitor and in cooperation with the capacitor array 24 having a total capacitance which is equal to a sum of the reference capacitance C and the weighted capacitances, equal in number to the predetermined number K less one. The total capacitance is equal to 31C when the predetermined number is equal to five. The aforementioned combining arrangement comprises the additional switched capacitor and a summing circuit which is connected to the input switched capacitor, the additional switched capacitor and the integrator 15 to sum the output electric charges and the additional electric charges into the input electric charges.

Furthermore, it is appreciated that the integrator 15 is operable at a high speed insofar as the second capacitance C2 is of the order of the reference capacitance C. More particularly, the above-mentioned time constant between equal to $C2 \cdot R$ and is unexpectedly smaller than the time constant which is equal to $32C \cdot R$ in the conventional oversampling analog-to-digital converter. This makes it unnecessary that the input capacitor 14, the integrating capacitor 17, and the reference and the weighted capacitors of the capacitor array 24 should hae small capacitances which are difficult to realize with precision. This moreover makes it unnecessary to use an intricate output circuit. As a result, the oversampling analog-to-digital converter can produce the output digital signal at a high oversampling frequency, with precision, and without unduly increased power consumption.

What is claimed is:

1. In an oversampling analog-to-digital converter having a converter input terminal supplied with an input analog signal, and comprising an input switched capacitor connected to said input terminal for sampling said analog signal into output electric charges, an integrator for integrating input electric charges into an integrated signal, a quantizer for quantizing said integrated signal into an output digital signal, a control logic responsive to said digital signal for producing a predetermined number of control signals, a reference voltage source, a capacitor array coupled to said reference voltage source and responsive to said control signals for producing controlled electric charges, and combining means connected to said input switched capacitor, said capacitor array, and said integrator for combining said output electric charges and said controlled electric charges into said input electric charges, the improvement wherein said combining means comprises:
- an additional switched capacitor connected to said capacitor array for sampling in cooperation with said capacitor array said controlled electric charges into additional electric charges in synchronism with sampling of said analog signal; and
- summing means connected to said input switched capacitor, said additional switched capacitor, and said integrator for summing said output electric charges and said additional electric charges into said input electric charges.

2. An oversampling analog-to-digital converter as claimed in claim 1, said input switched capacitor comprising an input capacitor coupled to said converter input terminal, having a first capacitance, and switched to produce said output electric charges, said integrator comprising an operational amplifier having a positive input terminal grounded, a negative input terminal, and an amplifier output terminal for said integrated signal, said capacitor array comprising a common signal line, a reference capacitor having a reference capacitance, and weighted capacitors having weighted capacitances equal to $2^k$ times said reference capacitance, respectively, where k represents natural numbers starting at unity and ending at said predetermined number less one, said reference capacitor and said weighted capacitors being connected to said common signal line and coupled to said reference voltage source to be controlled by the respective control signals and to collectively produce said controlled electric charges, wherein:
- said integrator comprising an integrating capacitor connected between said negative input terminal and said amplifier output terminal and having a second capacitance;
- said additional switched capacitor comprising an additional capacitor connected to said common signal line, having a third capacitance, and switched in synchronism with switching of said input capacitor to produce said additional electric charges in cooperation with said reference and said weighted capacitors;
- said summing means being for connecting a combination of said input capacitor and said additional capacitor to said negative input terminal in synchronism with switching of said input capacitor;
- each of said first through said third capacitances being substantially equal to said reference capacitance.

3. An oversampling analog-to-digital converter as claimed in claim 2, said input switched capacitor comprising an input switch for connecting said input capacitor to said converter input terminal and to ground successively in each oversampling period, said reference capacitor and said weighted capacitors being coupled to said reference voltage source through a switch array for connecting selected ones of said reference and said weighted capacitors and all of said reference and said weighted capacitors to said reference voltage source when said input switch connects said input capacitor to said converter input terminal and to ground, respectively, said selected ones of the reference and the weighted capacitors being selected in response to said control signals, wherein:
- said additional switched capacitor comprising an additional switch for disconnecting and connecting said additional capacitor to ground when said input switch connects said input capacitor to said converter input terminal and to ground, respectively;
- said summing means comprising a connecting switch for connecting said combination to said negative input terminal and to ground when said input switch connects said input capacitor to said converter input terminal and to ground, respectively.

* * * * *

UNITED STATES PATENT AND TRADEMARK OFFICE
CERTIFICATE OF CORRECTION

PATENT NO. : 4,876,544

DATED : October 24, 1989

INVENTOR(S) : Yoshiaki Kuraishi

It is certified that error appears in the above-identified patent and that said Letters Patent is hereby corrected as shown below:

[54] In the title, line 4 delete "SWITCHIN" and insert --SWITCHING--.

Col. 1, line 4, delete "SWITCHIN" and insert --SWITCHING--.

Col. 4, line 27, delete "20, 40, 80 and 160" and insert --2C, 4C, 8C, and 16C--.

Col. 5, line 8, delete "refrence" and insert --reference--.

Col. 5, line 22, delete "th34" and insert --the--.

Signed and Sealed this

Twentieth Day of November, 1990

Attest:

HARRY F. MANBECK, JR.

*Attesting Officer*     Commissioner of Patents and Trademarks